(12) United States Patent
Ashiya et al.

(10) Patent No.: US 6,643,134 B2
(45) Date of Patent: Nov. 4, 2003

(54) HOLDING AND HEAT DISSIPATION STRUCTURE FOR HEAT GENERATION PART

(75) Inventors: Hiroyuki Ashiya, Haibara-gun (JP); Yoshiyuki Tanaka, Haibara-gun (JP); Yayoi Maki, Haibara-gun (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 10/093,377

(22) Filed: Mar. 11, 2002

(65) Prior Publication Data

US 2002/0163783 A1 Nov. 7, 2002

(30) Foreign Application Priority Data

Mar. 12, 2001 (JP) ........................................ 2001-069125

(51) Int. Cl.[7] ................................................ H05K 7/20
(52) U.S. Cl. .................... 361/719; 174/52.1; 361/778; 361/818
(58) Field of Search .............................. 174/35 R, 52.1, 174/260, 50, 60; 165/80.3; 361/704, 707, 709–713, 717–719, 773, 775, 778, 816, 818

(56) References Cited

U.S. PATENT DOCUMENTS

| | | | | |
|---|---|---|---|---|
| 3,934,177 A | * | 1/1976 | Horbach | ................ 361/709 |
| 4,636,916 A | * | 1/1987 | Burt et al. | ................ 361/717 |
| 5,566,052 A | * | 10/1996 | Hughes | ................ 361/704 |
| 5,913,552 A | * | 6/1999 | McLellan et al. | ............ 29/843 |
| 6,049,469 A | * | 4/2000 | Hood, III et al. | ........... 361/818 |
| 6,194,656 B1 | * | 2/2001 | Kondo et al. | ............. 174/52.1 |

FOREIGN PATENT DOCUMENTS

JP 7-86717 3/1995

* cited by examiner

Primary Examiner—Gerald Tolin
(74) Attorney, Agent, or Firm—Sughrue Mion, PLLC

(57) ABSTRACT

In a holding and heat dissipation structure for a heat generation part for dissipating heat generated from the heat generation part having lead portions protruded from the main body thereof are soldered at a main substrate, a terminal plate is disposed at a position opposing to the main substrate with a predetermined distance therebetween, and a part housing portion for holding the part is provided at the terminal plate. The part housing portion is concavely formed. Insertion holes for inserting the lead portions protruded from the main body are formed at the part housing portion and the main substrate, respectively. The lead portions are inserted into these insertion holes, and the lead portions and the land portions of the main substrate are fixed to each other by the soldering in a state that the main body is separated from the bottom surface of the part housing portion.

3 Claims, 17 Drawing Sheets

HOLDING AND HEAT DISSIPATION STRUCTURE FOR HEAT GENERATION PART

CROSS REFERENCE TO RELATED APPLICATION

The present application is based on Japanese Patent Application No 2001-69125, the entire contents of which are incorporated herein by reference.

BACKGROUND OF THE INVENTION

1. Field of the Invention

The present invention relates to a holding and heat dissipation structure for a heat generation part which is arranged in a manner that heat generation parts such as resistors used in an electronic control unit (ECU), for example, are held by a print board by the soldering thereby to dissipate the heat generated from the parts.

2. Related Art

Such a kind of the holding and heat dissipation structure for a heat generation part is disclosed in Unexamined Japanese Patent Publication JP 07-86717A shown in FIG. 20. As shown in FIG. 20, the holding and heat dissipation structure for a heat generation part is configured in a manner that through hole 2 is formed at a printed board 1 and the attachment portions 3a of a heat dissipation member 3 made of metal are fixed to concave portions 2a of the through hole 2 by solder 4, respectively.

Lead portions 5b protruded from the main body 5a of a heat generation part 5 are fixed by solder 6 on not-shown land portions formed around the heat dissipation member 3 of the printed board 1, respectively. Further, the main body 5a of the heat generation part 5 is fixed to the heat dissipation member 3 by solder 7, so that radiation heat from the main body 5a of the heat generation part 5 is dissipated by the heat dissipation member 3.

However, according to the conventional holding and heat dissipation structure of the heat generation part 5, it is required to form the through hole 2 at the printed board 1 and fix the heat dissipation member 3 as another part at the through hole 2 by the solder 4. Further, it is required to fix the lead portions 5b of the heat generation part 5 with the printed board 1 by the solder 6 and also to fix the main body 5a of the heat generation part 5 to the heat dissipation member 3 by the solder 7. Accordingly, since there are many soldering portions, the cost of the structure becomes high according to the number of the soldering portions and the assembling procedure becomes troublesome.

SUMMARY OF THE INVENTION

Accordingly, the invention has been made in order to solve the aforesaid problem of the conventional technique, and an object of the invention is to provide a holding and heat dissipation structure for a heat generation part which can reduce simply at a low cost the increase of the temperature at soldering portions between the heat generation part and a substrate due to radiation heat from the main body of the heat generation part and also can surely prevent the occurrence of the crack of the solder.

(1) The above problems are solved by a holding and heat dissipation structure for a heat generation part soldered at a substrate and having lead portions protruded from a main body thereof, the holding and heat dissipation structure comprising: a heat shielding plate disposed at a position opposing to the substrate with a predetermined clearance therebetween; and a part housing portion provided on the heat shielding plate for holding the heat generation part therein.

According to the thus configured holding and heat dissipation structure for a heat generation part, the soldering procedure between the substrate and the lead portions protruding from the main body of the heat generation part can be performed in the stable state that the heat generation part is held by the part housing portion of the heat shielding plate. After the soldering procedure, the heat due to the radiation heat from the main body of the heat generation part can be dissipated and shielded by the heat shielding plate, whereby the temperature at the soldered portions can be prevented from being increased. As a result, the magnitude of the thermal stress acting on the soldered portions can be reduced and so the occurrence of the crack of the solder at the soldered portions can be surely prevented.

(2) There is also provided a holding and heat dissipation structure for a heat generation part according to (1), wherein the part housing portion of the heat shielding plate is formed in a concave shape, insertion holes for inserting the lead portions are formed on the part housing portion and the substrate, respectively, the lead portions are inserted into the insertion holes of the part housing portion and the substrate, and the lead portions and land portions of the substrate are fixed to each other by soldering.

According to the thus configured holding and heat dissipation structure for a heat generation part, the insertion holes of the concave part housing portion of the heat shielding plate can be simply formed so as to coincide with the pitch of the lead portions of the heat generation part, and the soldered portions are required only at the portions between the lead portions of the heat generation part and the land portions of the substrate. Accordingly, the increase of the temperature at the soldered portions due to the radiation heat from the main body of the heat generation part can be suppressed simply at a low cost and so the occurrence of the crack of the solder at the soldered portions can be further surely prevented.

(3) There is also provided a holding and heat dissipation structure for a heat generation part according to (2), wherein the lead portions protruding from the main body are inserted into the insertion holes of the part housing portion of the heat shielding plate and the substrate, and the lead portions and the land portions of the substrate are fixed to each other by the soldering in a state that the main body of the heat generation part is separated from a bottom surface of the part housing portion.

According to the thus configured holding and heat dissipation structure for a heat generation part, since the main body of the heat generation part does not directly contact with the heat shielding plate, the deterioration due to the heat of the heat shielding plate can be surely prevented. Further, the heat due to the radiation heat from the main body of the heat generation part can be surely dissipated on the heat shielding plate side from the concave part housing portion, so that the dissipation effect can be improved.

DETAILED DESCRIPTION OF THE PREFERRED EMBODIMENTS

The embodiment of the invention will be hereinafter explained based on the accompanying drawings.

Figure 1:
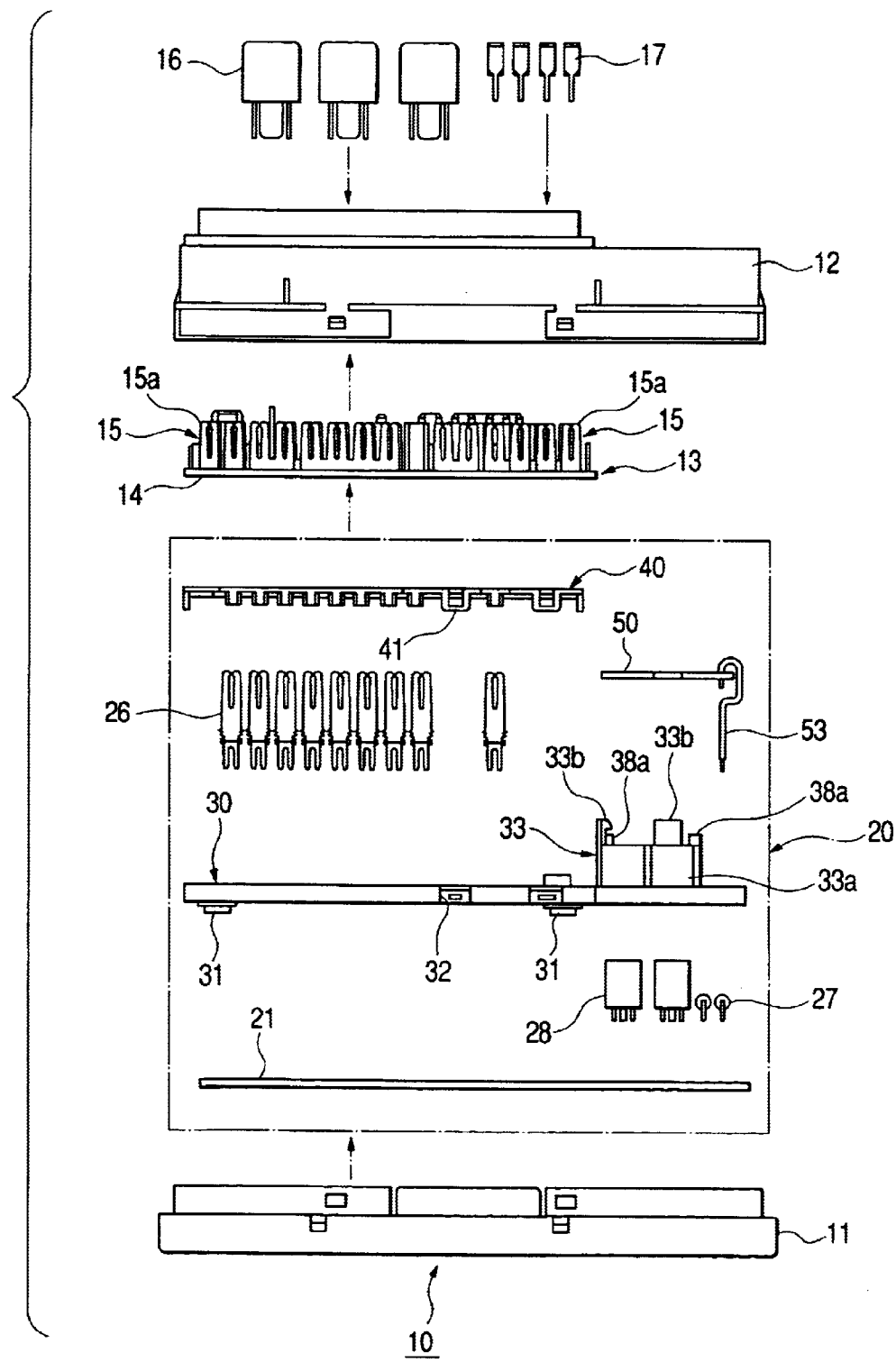
FIG. 1 is an exploded front view showing the electronic control unit embedded type electric coupling box according to the embodiment of the invention.
Figure 2:
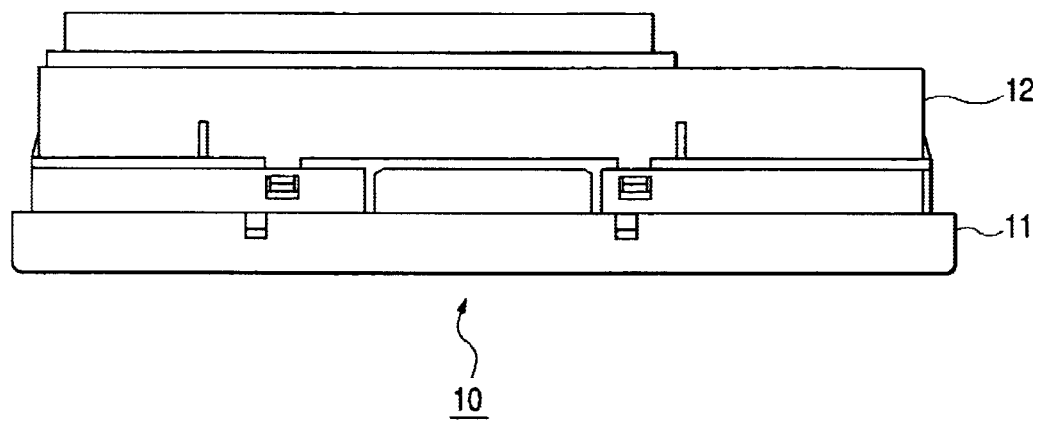
FIG. 2 is a front view of the electric coupling box.
Figure 3:
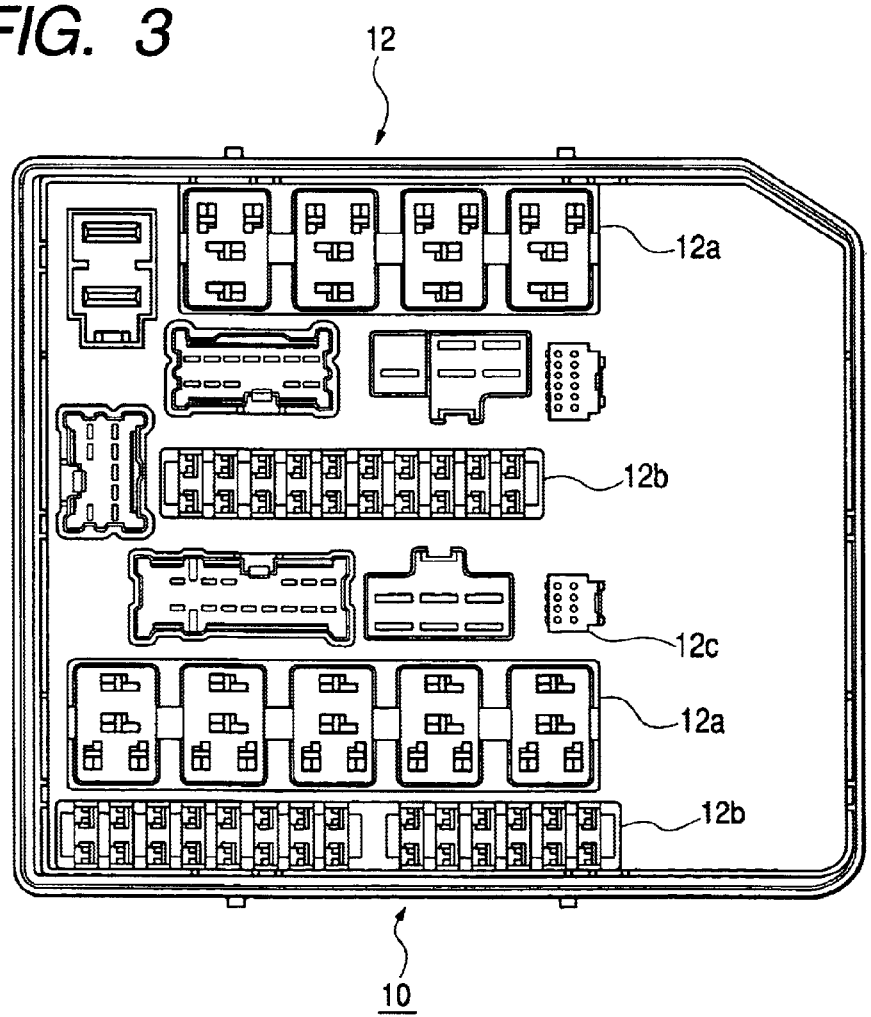
FIG. 3 is a plan view of the electric coupling box.
Figure 4:
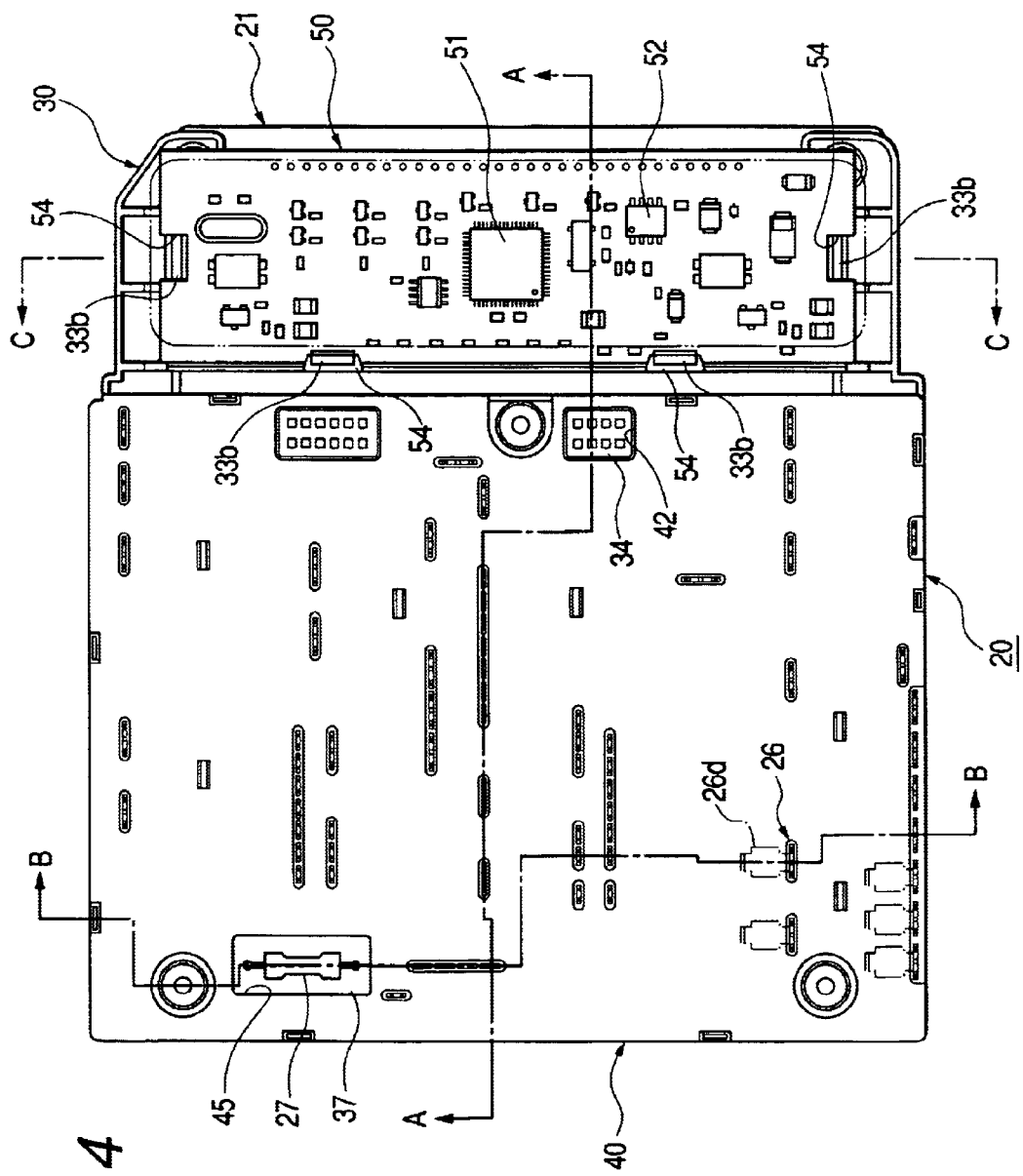
FIG. 4 is a plan view of the electronic control unit contained within the electric coupling box.
Figure 5:
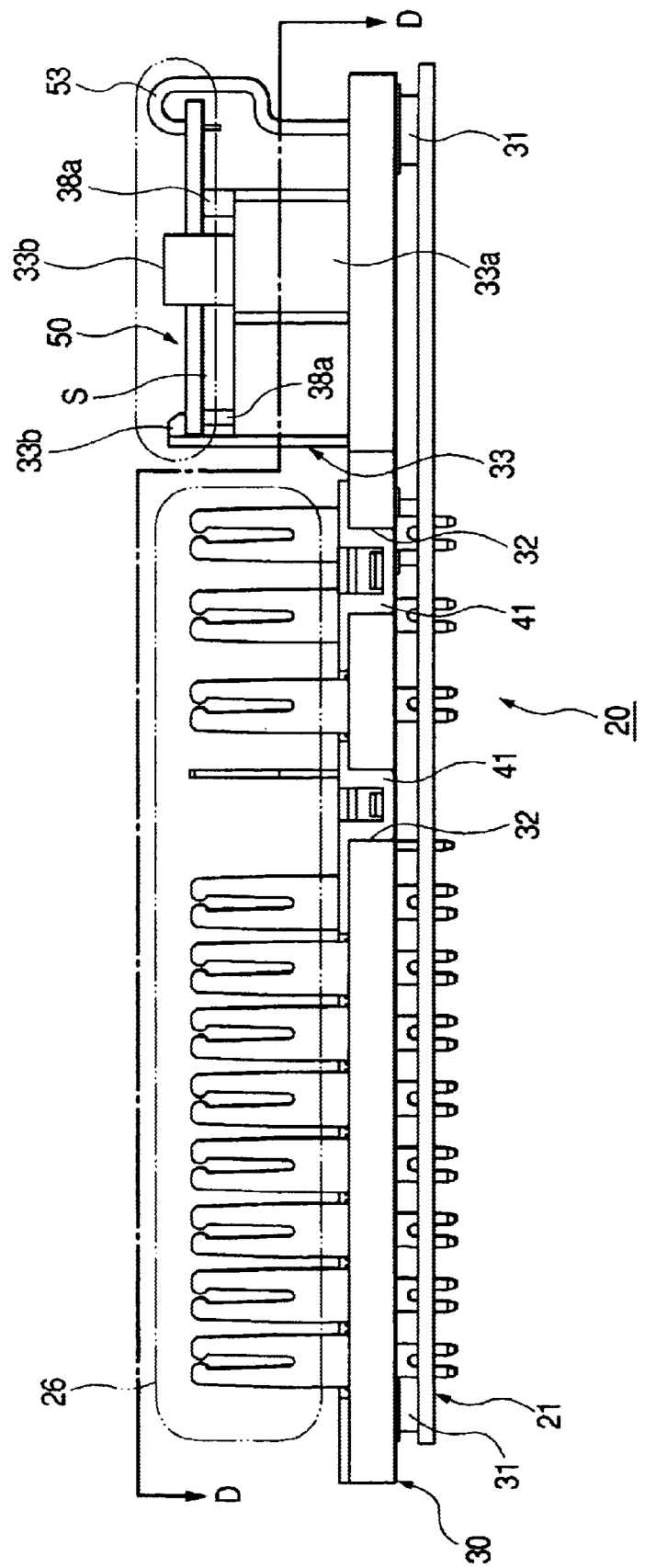
FIG. 5 is a front view of the electronic control unit.
Figure 6:
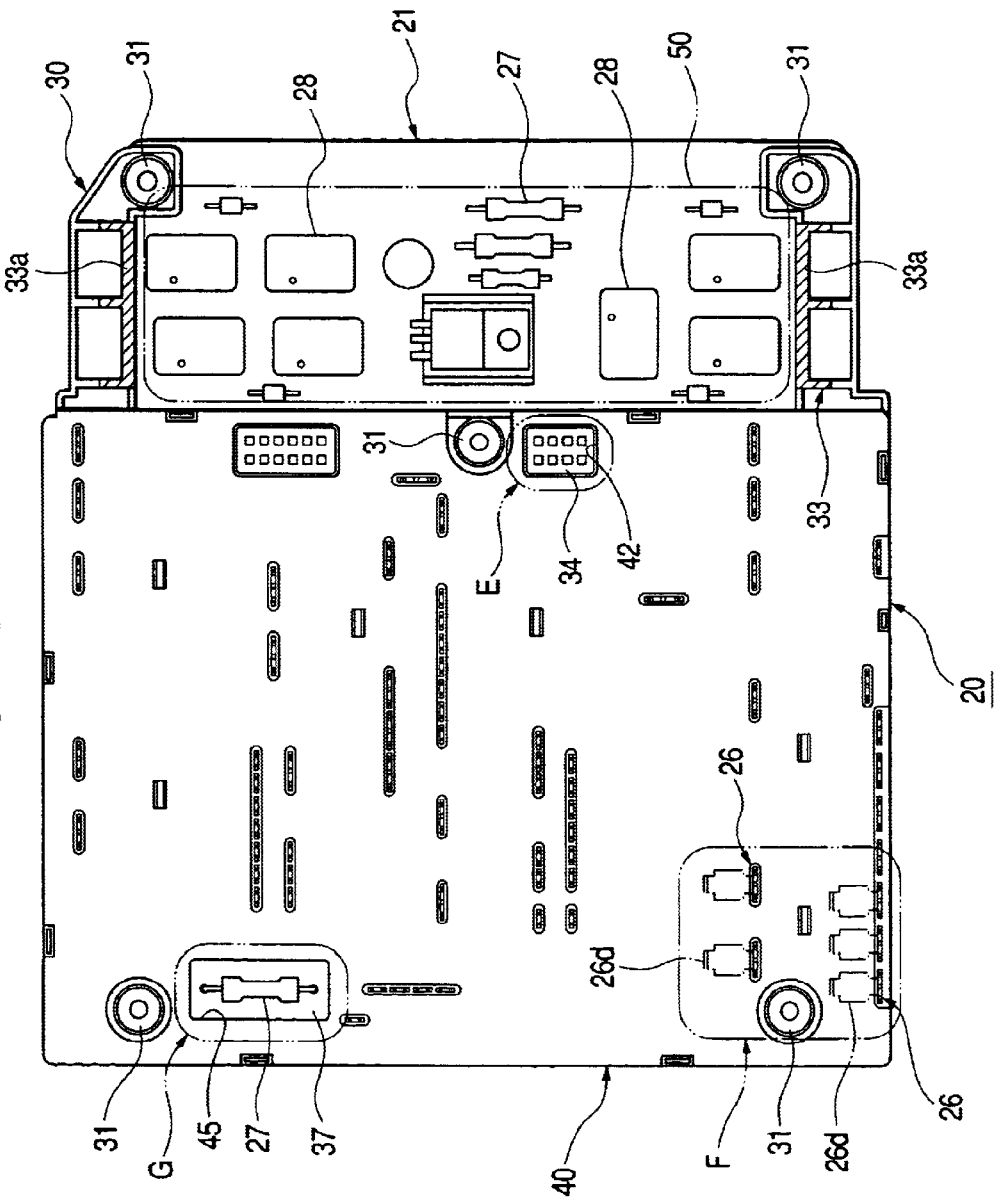
FIG. 6 is a sectional view along a line D—D in FIG. 5.
Figure 7:
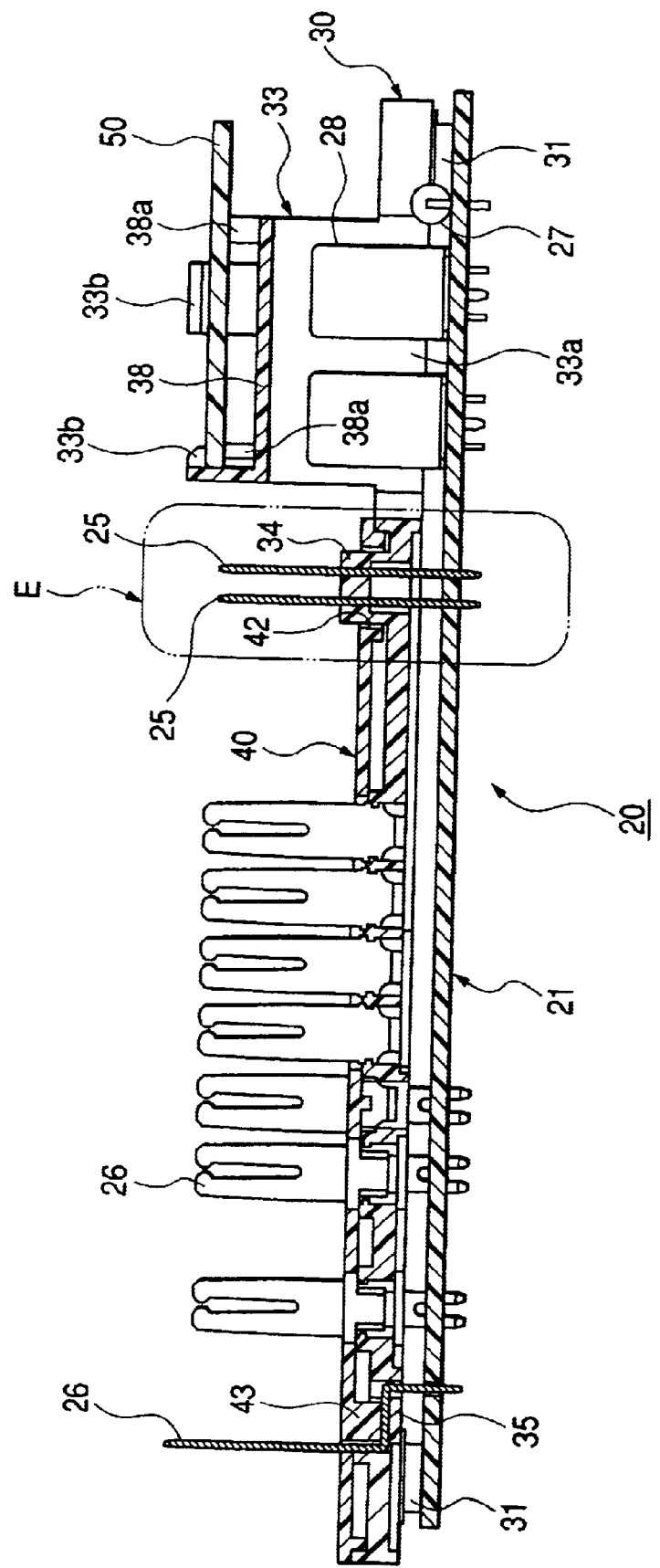
FIG. 7 is a sectional view along a line A—A in FIG. 4.
Figure 8:
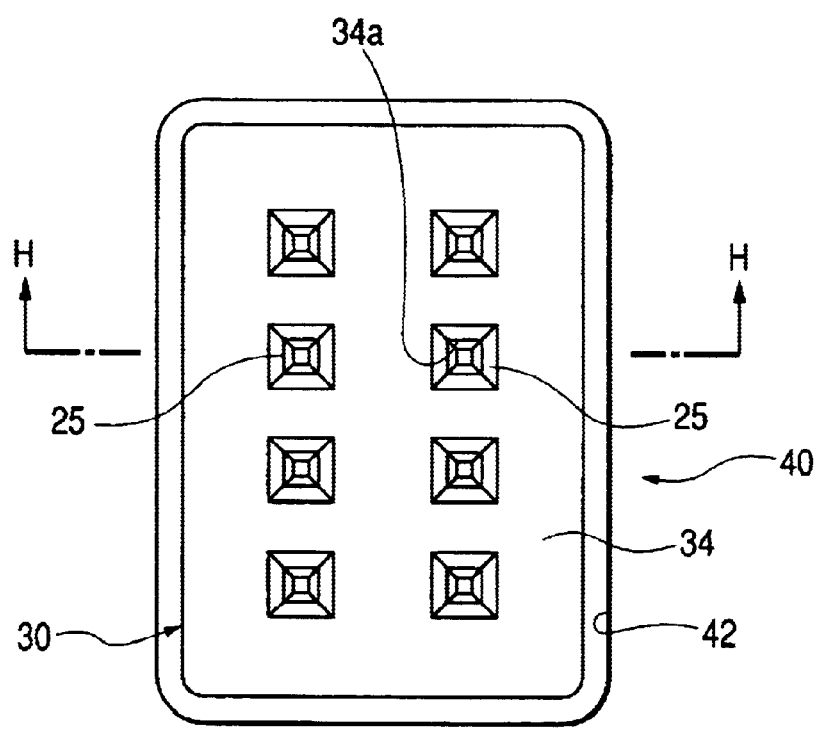
FIG. 8 is an enlarged plan view of a portion E in FIG. 6.
Figure 9:
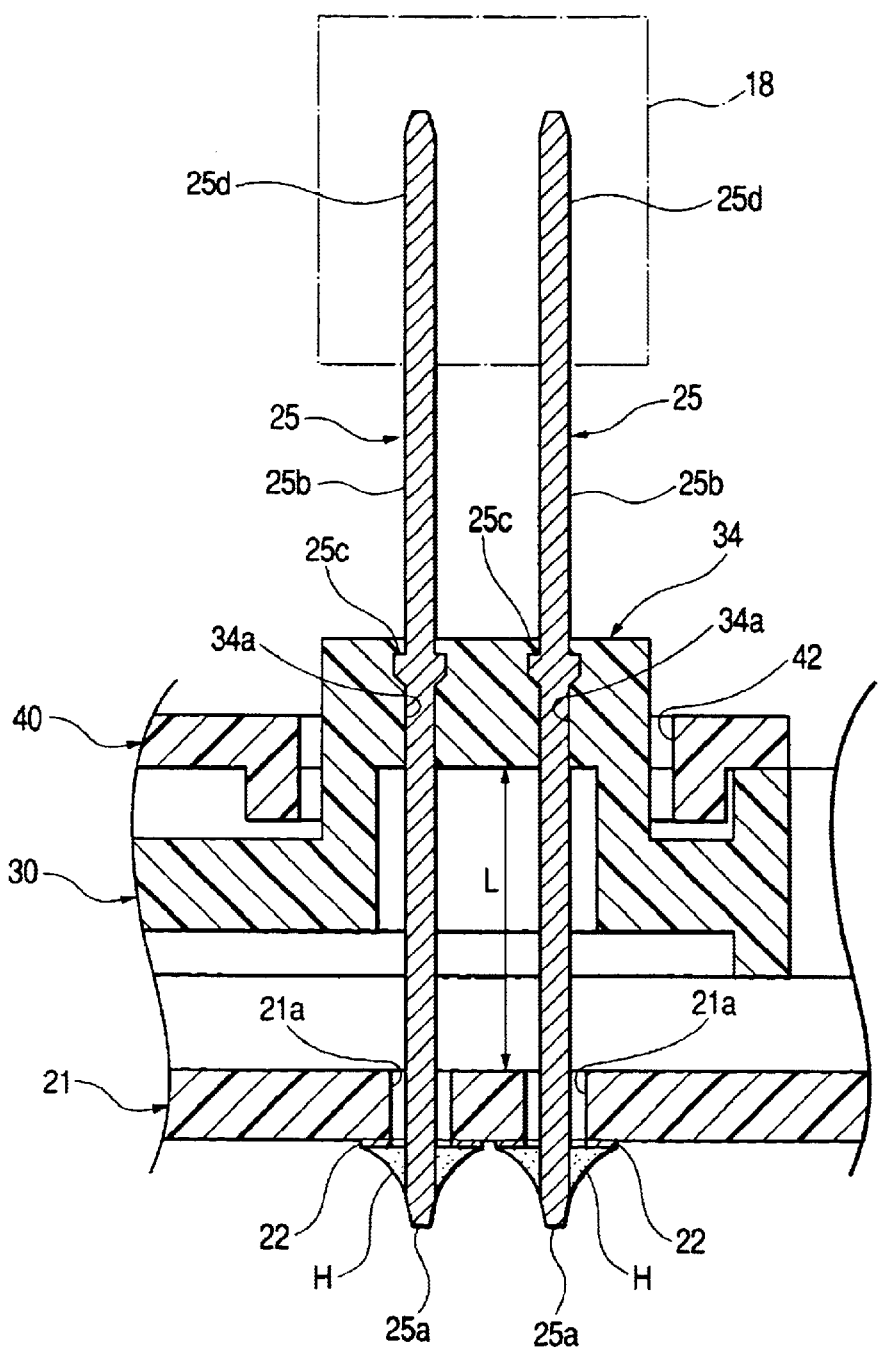
FIG. 9 is a sectional view along a line H—H in FIG. 8.
Figure 10:
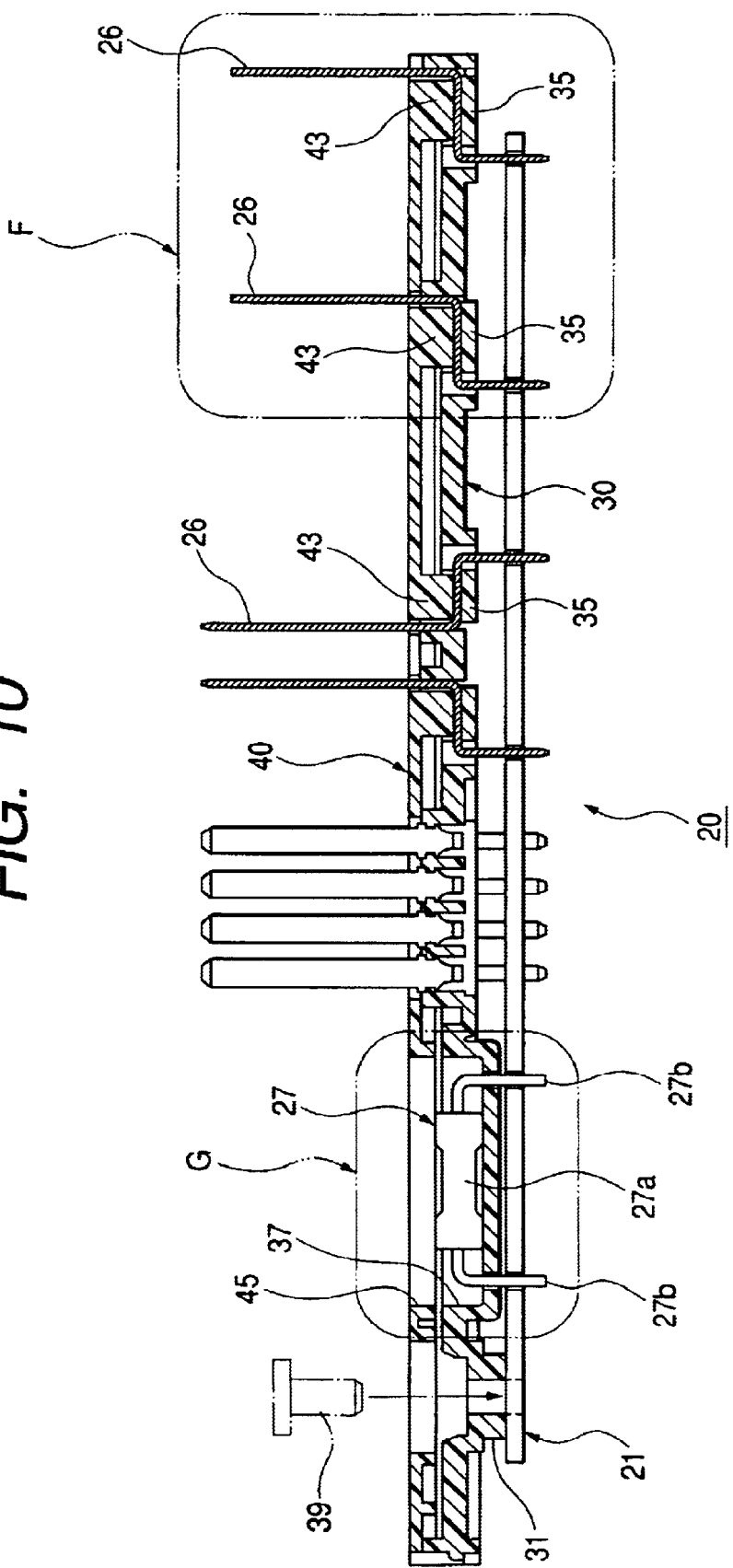
FIG. 10 is a sectional view along a line B—B in FIG. 4.
Figure 11:
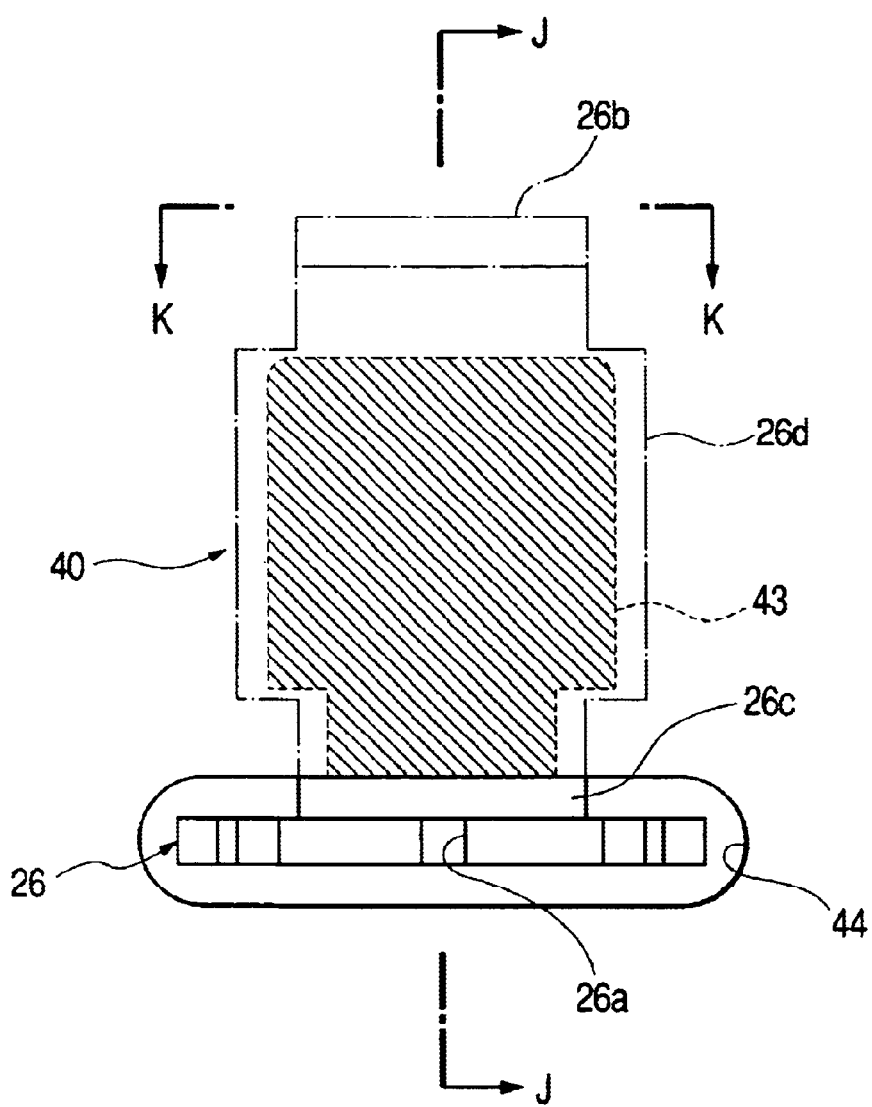
FIG. 11 is an enlarged plan view of a portion F in FIG. 6.
Figure 12:
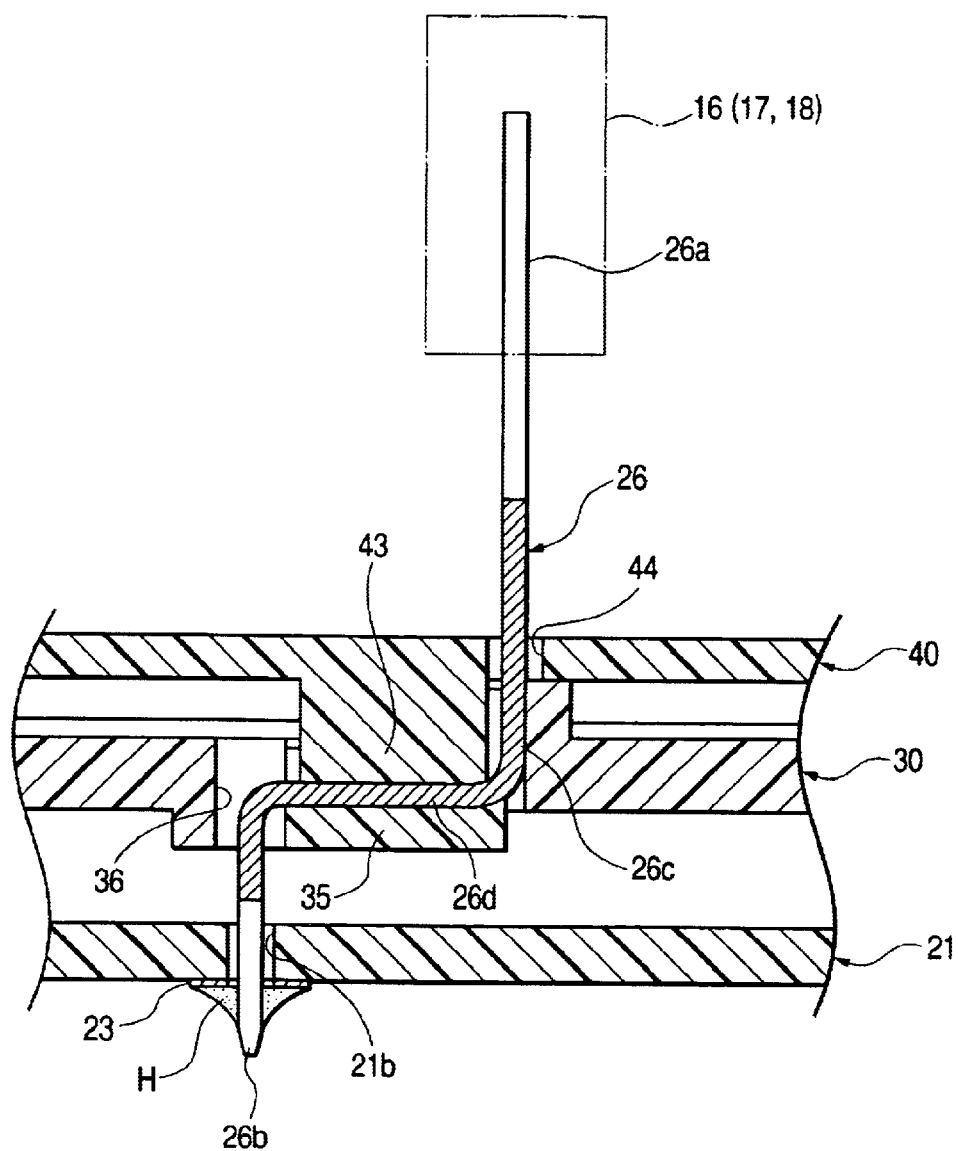
FIG. 12 is a sectional view along a line J—J in FIG.
Figure 13:
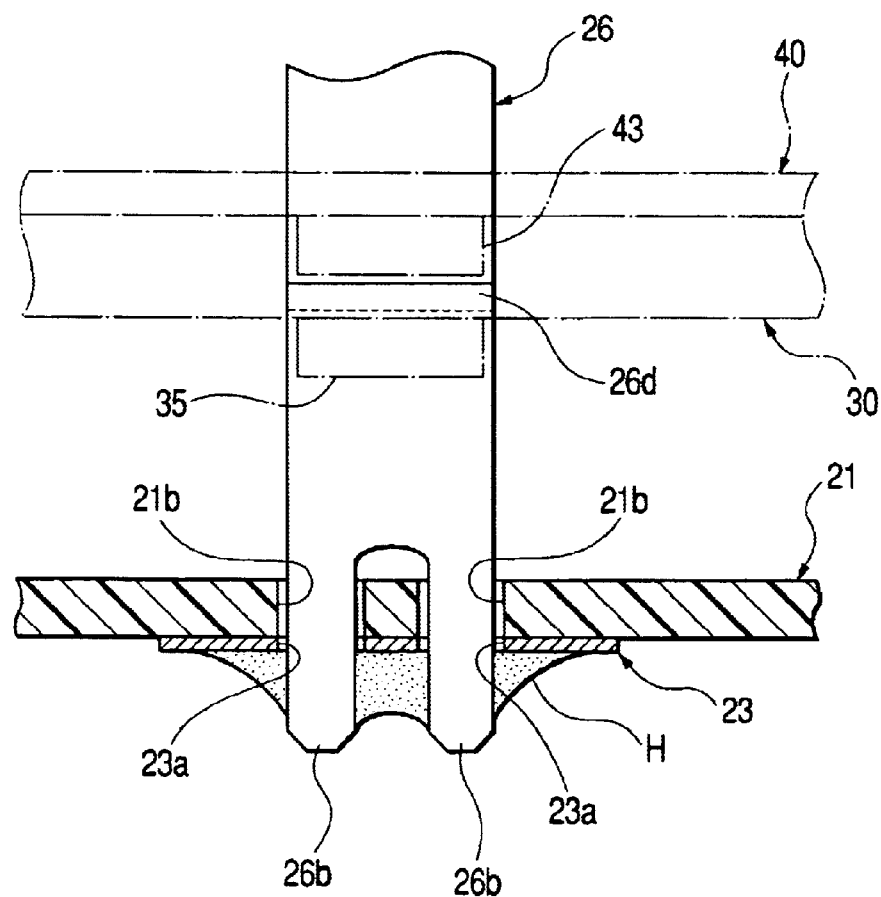
FIG. 13 is a sectional view along a line K—K in-FIG. 11.
Figure 14:
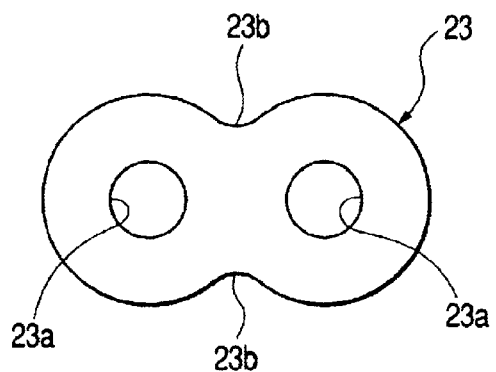
FIG. 14 is an explanatory diagram showing a land portion used in the electronic control unit.
Figure 15:
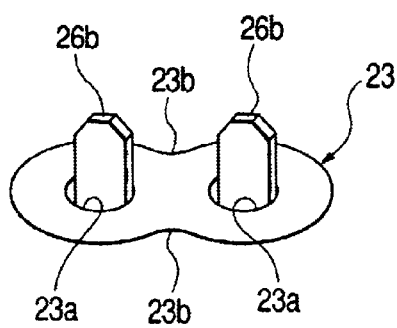
FIG. 15 is a perspective view showing the relation between the land portion and a terminal.
Figure 16:
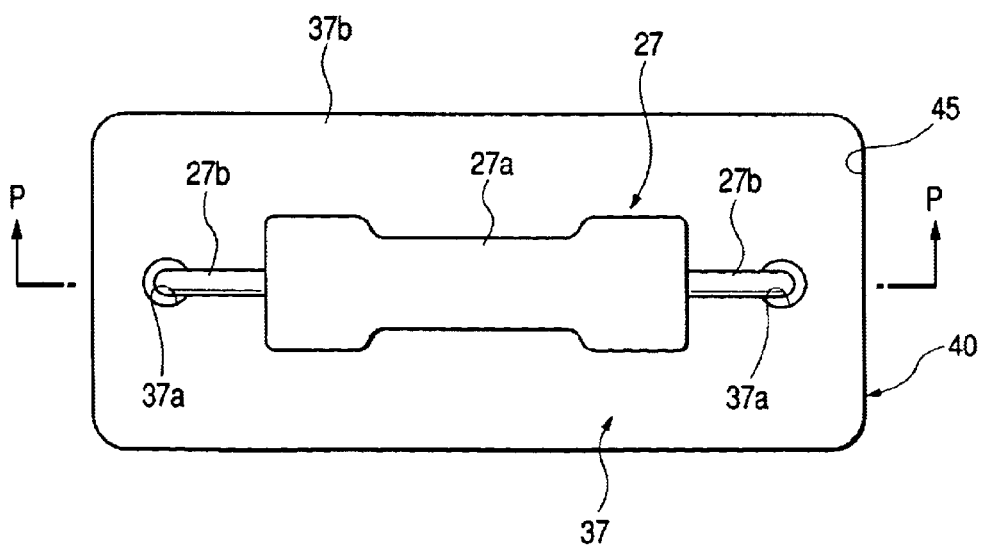
FIG. 16 is an enlarged plan view of a portion G in FIG. 6.
Figure 17:
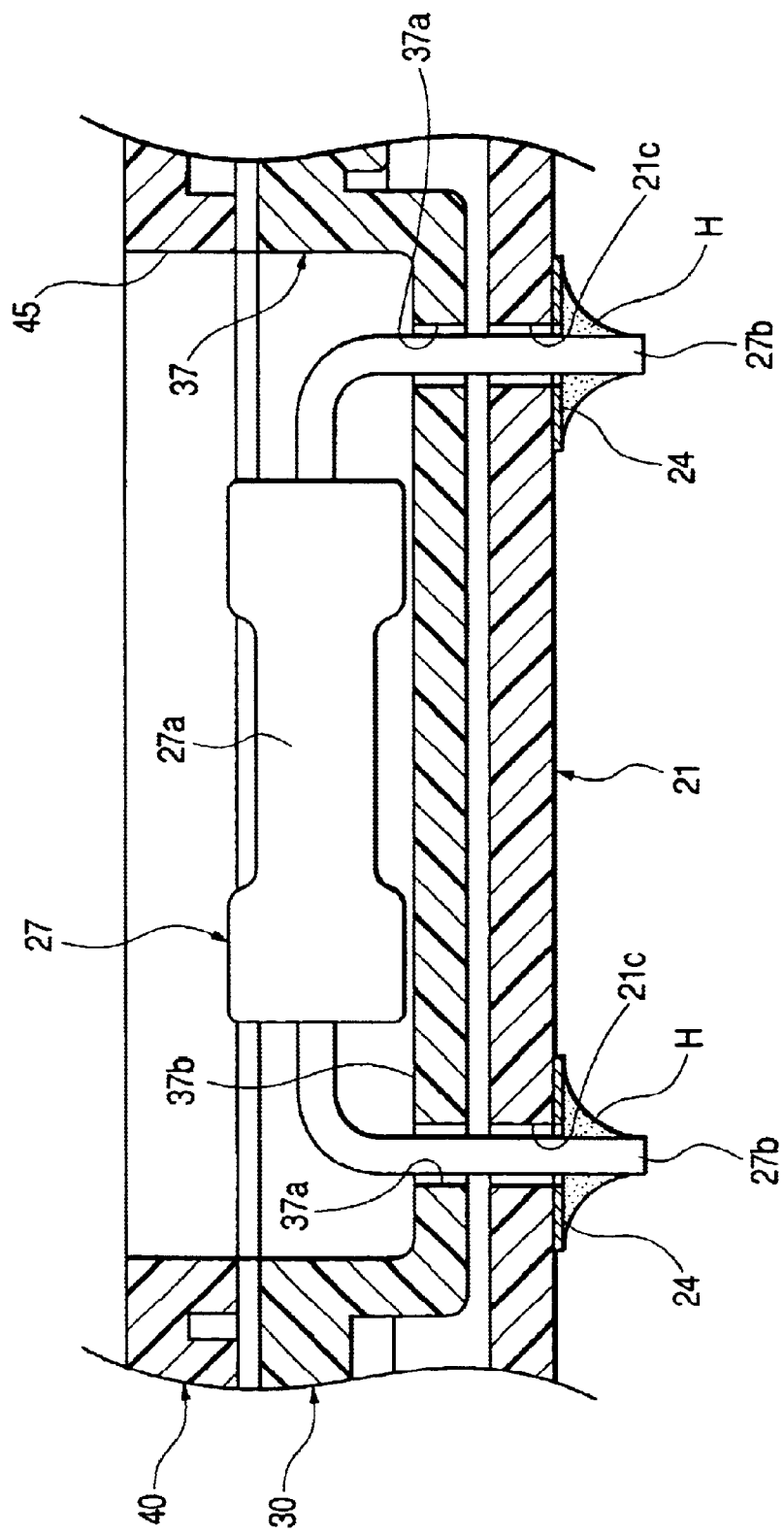
FIG. 17 is a sectional view along a line P—P in FIG. 16.
Figure 18:
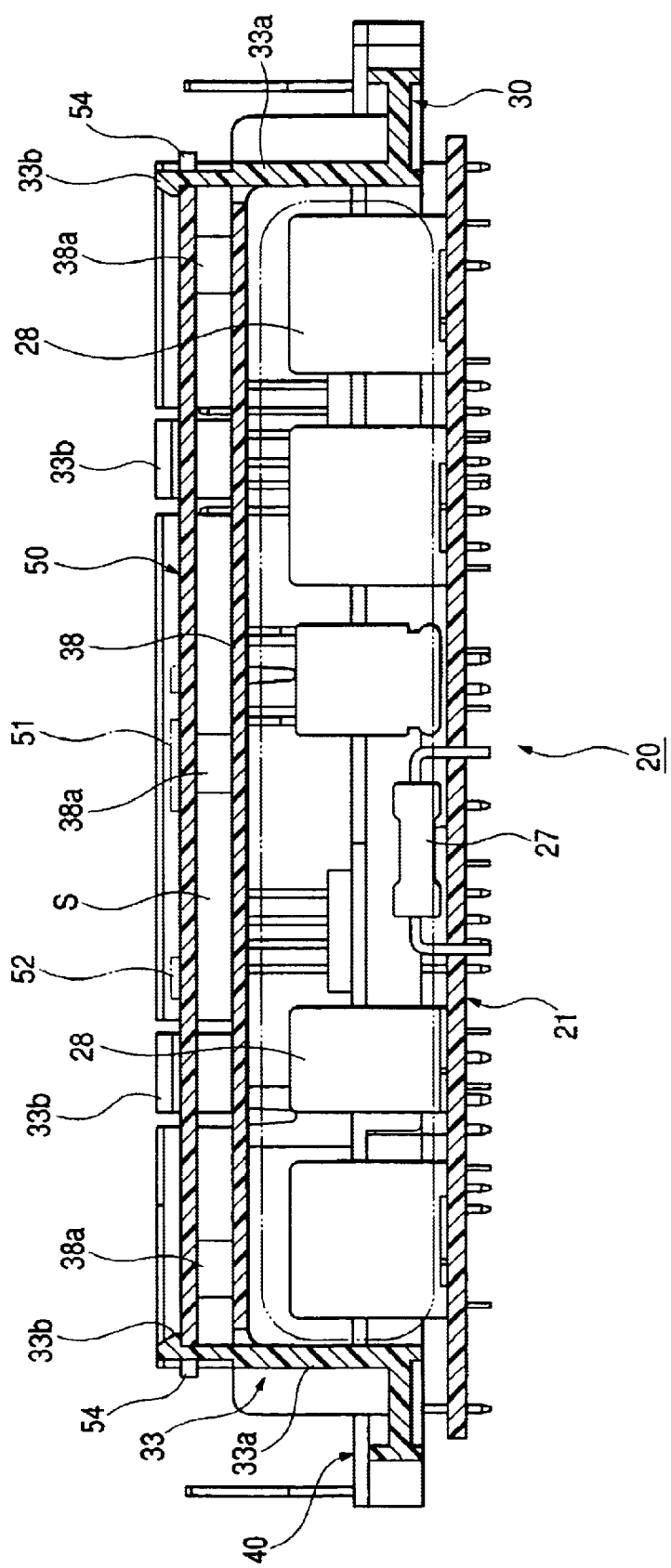
FIG. 18 is a sectional view along a line C—C in FIG. 4.
Figure 19:
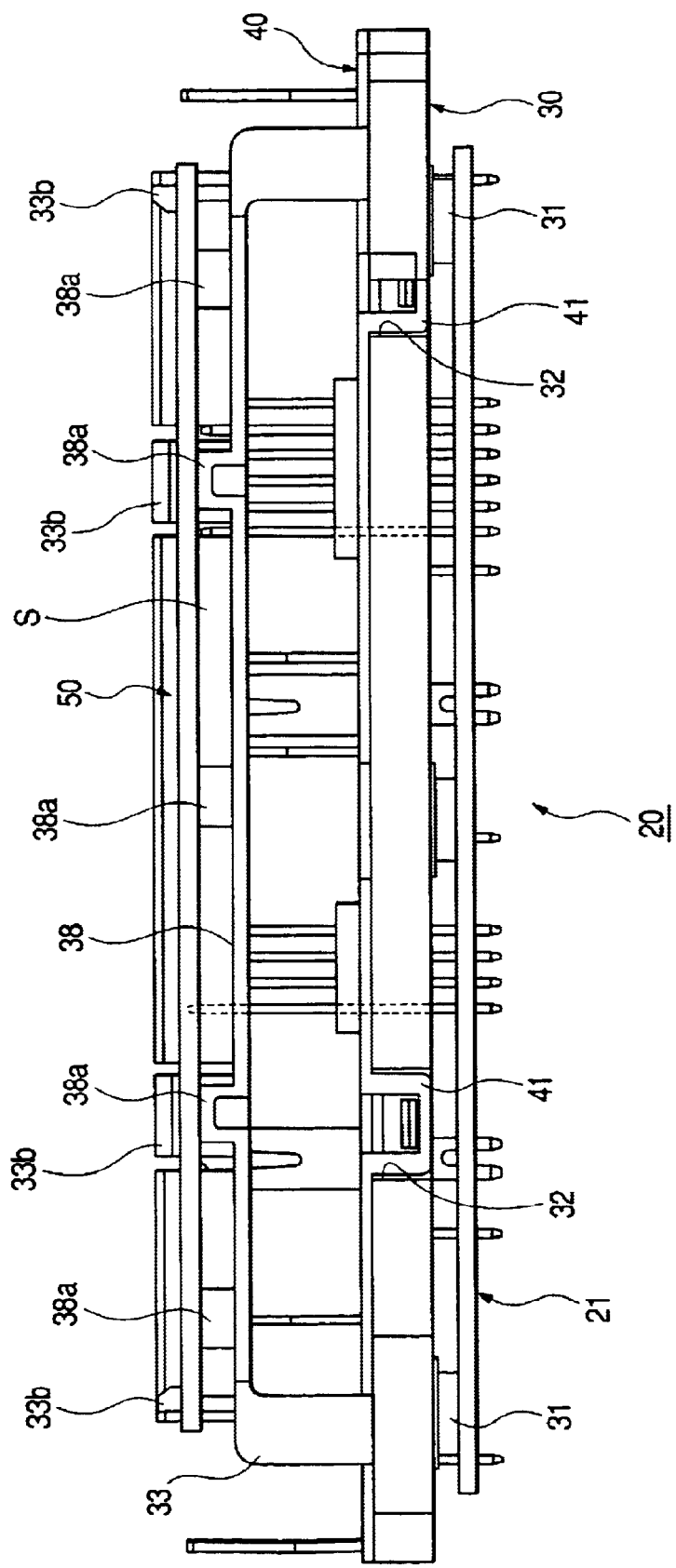
FIG. 19 is a right side view of the electronic control unit.
Figure 20:
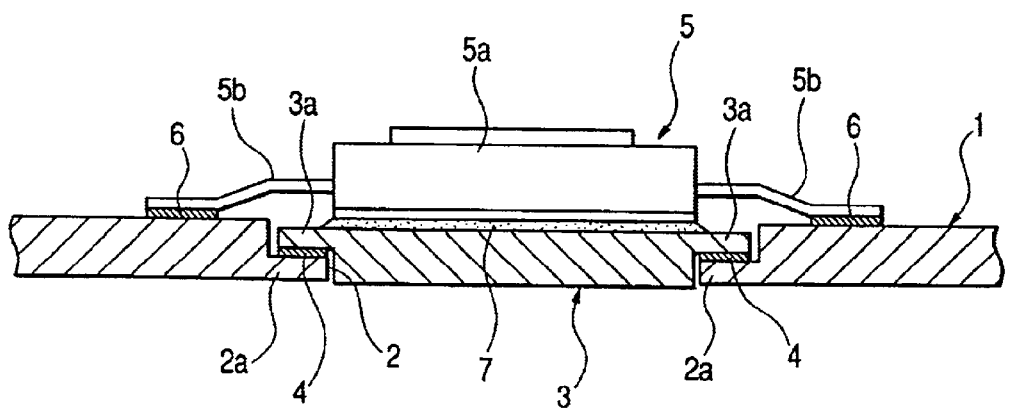
FIG. 20 is a sectional view showing a conventional holding and heat dissipation structure for a heat generation part.

FIG. 1 is an exploded front view showing the electronic control unit embedded type electric coupling box according to the embodiment of the invention, FIG. 2 is a front view of the electric coupling box, FIG. 3 is a plan view of the electric coupling box, FIG. 4 is a plan view of the electronic control unit contained within the electric coupling box, FIG. 5 is a front view of the electronic control unit, FIG. 6 is a sectional view along a line D—D in FIG. 5, FIG. 7 is a sectional view along a line A—A in FIG. 4, FIG. 8 is an enlarged plan view of a portion E in FIG. 6, FIG. 9 is a sectional view along a line H—H in FIG. 8, FIG. 10 is a sectional view along a line B—B in FIG. 4, FIG. 11 is an enlarged plan view of a portion F in FIG. 6, FIG. 12 is a sectional view along a line J—J in FIG. 11, FIG. 13 is a sectional view along a line K—K in FIG. 11, FIG. 14 is an explanatory diagram showing a land portion used in the electronic control unit, FIG. 15 is a perspective view showing the relation between the land portion and a terminal, FIG. 16 is an enlarged plan view of a portion G in FIG. 6, FIG. 17 is a sectional view along a line P—P in FIG. 16, FIG. 18 is a sectional view along a line C—C in FIG. 4, and FIG. 19 is a right side view of the electronic control unit.

As shown in FIGS. 1 to 3, the electronic control unit embedded type electric coupling box 10 is almost configured by a box-shaped upper case 11 made of synthetic resin, a box-shaped main cover 12 made of synthetic resin which is fitted to the upper case 11 so as to freely engage therewith and separate therefrom, a bus bar layer 13 which is disposed on the upper surface side within the main cover 12, and an electronic control unit (ECU) 20 contained between the upper case 11 and the main cover 12 on the lower side of the bus bar layer 13. The electric coupling box 10 is used mainly in order to distribute the electric power in an automobile, for example, and the electronic control unit 20 controls the on and off operations of the engine, lights, wiper etc. of an automobile, for example.

As shown in FIG. 1, the bus bar layer 13 is arranged to dispose a plurality of bus bars 15 on an insulation substrate 14. Each of the bus bars 15 is formed in a manner that one end side thereof is bent upward as a press-contact portion 15a etc. of slit blade shape. The press-contact portion 15a etc. of each of the bus bars 15 extends to and protrudes from a relay attachment portion 12a and a fuse attachment portion 12b which are formed integrally with and protrusively from the upper surface side of the main cover 12 shown in FIG. 3. Plug-in relays 16 as electronic parts are attached to the relay attachment portion 12a and fuses 17 as electronic parts are attached to the fuse attachment portion 12b.

As shown in FIGS. 1, 4, 5, 10 and 19, the electric control unit 20 is configured by a rectangular plate shaped main substrate 21 made of synthetic resin on which straight-shaped and crank-shaped terminals 25, 26, and resistors 27 and relays 28 etc. each serving as an electronic part are mounted; an almost plate-shaped terminal plate (which serves as a heat shielding plate) 30 made of synthetic resin to which the main substrate 21 is fixed by screws 39 etc. on the lower surface side of the terminal plate so that the terminal plate opposes to the main substrate 21 with a predetermined clearance therebetween through a plurality of cylindrical boss portions 31; a plate shaped plate cover 40 made of synthetic resin disposed on the upper side of the terminal plate 30 so as to oppose to a part of the terminal plate 30 (except for an area of a holding plate 33) with a predetermined clearance therebetween through convex portions 41 such as a plurality of hook portions etc. fitting with a plurality of concave portions 32 of the terminal plate 30; and a rectangular plate shaped control substrate 50 which is laminated on and held by the main substrate 21 through the holding plate 33 of the terminal plate 30 with a predetermined distance therebetween, on which a plurality of control parts 51, 52 such as a microcomputer (CPU) etc. are mounted, and which is coupled to the main substrate 21 through a jumper wire 53 and a not-shown terminal etc.

As shown in FIGS. 6 to 9, when the main substrate 21 and the terminal plate 30 are assembled, a soldering portion 25a at the lower end of each of the straight and rod-shaped terminals 25 is arranged to be guided into the coupling hole 21a of the main substrate 21 by the terminal plate 30. That is, when the main substrate 21 is assembled with the terminal plate 30, the coupling holes 21a of the main substrate 21 coincide in their positions with the positions of the positioning holes 34a of the terminal plate 30 for holding the midway portions 25b of the terminals 25, respectively. Then, the soldering portions 25a of the terminals 25 are guided and inserted within the coupling holes 21a of the main substrate 21 at the position opposing to the terminal plate 30 with the predetermined clearance therebetween.

Then, the soldering portions 25a of the terminals 25. inserted into the coupling holes 21a of the main substrate 21 are soldered at the land portions 22 formed on the lower surface of the main substrate 21 and held by the main substrate 21 in a state that the terminals 25 are erected vertically, respectively. The soldered portions (solder fillets) are represented by symbols H.

A convex portion (engagement portion) 25c to be engaged within the positioning hole 34a of the terminal plate 30 is integrally formed at the midway portion 25b of each of the terminals 25 so as to protrude therefrom annularly. A plurality of the positioning holes 34a of the terminal plate 30 are provided in two rows at the center portion of a terminal press-in portion 34 which protrudes in a block shape on the upper surface side of the terminal plate 30. The terminal press-in portion 34 protrudes upward from the opening portion 42 of the plate cover 40, and the upper ends 25d of the terminals 25 exposed from the terminal press-in portion 34 protrude to the connector attachment portions 12c of the main cover 12. An external connector 18 serving as an electric part is fitted on the upper ends 25d of the terminals 25.

The convex portions 25c of the terminals 25 are pressed into the positioning holes 34a of the terminal plate 30 and engaged at the predetermined positions thereof, respectively, in a manner that this engagement state is not released sufficiently even if dynamical stress due to the attachment or detachment of the external connector 18 is applied to the engagement portions.

As shown in FIG. 4 and FIGS. 10 to 13, each of the L crank-shaped terminals 26 for large current each having an entirely large width is configured to have a slit blade shaped press-contact portion 26a at the upper end (one end) side thereof so that a heat generation part such as the plug-in relay 16 or the fuse 17 and the external connector 18 is coupled to the press-contact portion freely. A pair of soldering portions 26b, 26b split in two pieces on the lower end (the other end) side of each of the terminals 26 are inserted into the coupling holes 21b of the main substrate 21 in a vertically erected state, then soldered at land portions 23 formed on the lower surface of the main substrate 21 and so held by the main substrate 21, respectively. These soldered portions (solder fillets) are represented by symbols H.

Further, as shown in FIG. 11, a flat portion 26d having a large width is formed at the midway portion 26c of each of the terminals 26 in a bent fashion so as to be in parallel to the main substrate 21. Each of the flat portions 26d freely abuts against the terminal pressing portion 35 of the terminal plate 30 which is disposed at the position opposing to the main substrate 21 with a predetermined clearance therebetween. The flat portion 26d with a large width of each of the terminals 26 freely abuts against the terminal pressing portion 43 provided at the plate cover 40 made of resin covering the terminal plate 30 which is disposed so as to have a predetermined clearance from the terminal plate 30. That is, the flat portion 26d with the large width of each of the terminals 26 is sandwiched between the terminal pressing portion 35 of the terminal plate 30 and the terminal pressing portion 43 of the plate cover 40.

Terminal insertion holes 36, 44 are formed in the vicinity of the terminal pressing portions 35, 43 of the terminal plate 30 and the plate cover 40, respectively. The press-contact portion 26a of each of the terminals 26 exposed from the terminal insertion hole 44 of the plate cover 40 protrudes to the relay attachment portion 12a, the fuse attachment portion 12b and the connector attachment portion 12c etc. Further, as shown by slanted lines in FIG. 11, each of the terminal pressing portions 43 of the plate cover 40 is formed to have a large width and almost the same shape as the flat portion 26d having the large width of the terminal 26. As shown in FIG. 13, each of the terminal pressing portions 35 of the terminal plate 30 is formed to have a large width in the same manner.

Further, as shown in FIGS. 13 and 15, each of the soldering portions 26b, 26b at the lower ends of the L crank-shaped terminals 26 is split in two pieces. A pair of the coupling holes 21b, 21b are formed at: positions of the main substrate 21 opposing to the pair of the soldering portions 26b, 26b of the terminal 26, respectively. Further, as shown in FIGS. 13 to 15, a pair of round-shaped terminal insertion holes 23a, 23a are formed at positions of the land portion 23 opposing to the pair of the soldering portions 26b, 26b of the terminal 26, respectively. Further, a pair of narrow portions 23b, 23b are formed around the land portion 23 between the pair of the terminal insertion holes 23a, 23a of the land portion 23.

As shown in FIGS. 6, 10, 16 and 17, a part housing portion 37 for housing and holding the resistor (heat generation part) 27 is formed in a concave shape at the predetermined position of the terminal plate 30. A pair of insertion holes 37a, 37a and a pair of insertion holes 21c, 21c for inserting therein the pair of lead portions 27b, 27b protruding from the main body 27a of the resistor 27 are formed at the concave part housing portion 37 and the main substrate 21, respectively.

Then, the lead portions 27b of the resistor 27 are inserted into the insertion holes 37a, 21c of the concave part housing portion 37 and the main substrate 21, respectively, and then the lead portions 27b and the land portions 24 formed on the lower surface side of the main substrate 21 are freely fixed and held to each other by the soldering in a state that the main body 27a of the resistor 27 is separated from the bottom surface 37b of the concave part housing portion 37. These soldered portions (solder fillets) are represented by symbols H. Incidentally, an opening portion 45 having the same size and shape as the part housing portion 37 is formed at the position of the plate cover 40 opposing to the part housing portion 37.

As shown in FIGS. 5 to 7, 18 and 19, the control substrate 50 mounting the control parts 51, 52 such as the microcomputer (CPU) etc. thereon is laminated and held on the main substrate 21, on which the heat generation parts such as the resistor 27 and the relay 28 etc. are mounted, through the holding plate 33 integrally and protrusively formed at the right side of the terminal plate 30 in a manner that the control substrate 50 and the main substrate 21 is separated with a predetermined distance therebetween. That is, a heat shielding plate 38 is integrally formed at the upper ends of a pair of the side wall portions 33a, 33a of the holding plate 33 on the top surface side of the holding plate 33. An air layer S is formed between the heat shielding plate 38 and the control substrate 50 through a plurality of convex portions 38a which are integrally and protrusively formed on the upper surface of the heat shielding plate 38.

The control substrate 50 is positioned through hook-shaped hook portions 33b which engage with a plurality of concave portions 54 of the control substrate 50 and are integrally formed at the pair of the side wall portions 33a, 33a of the holding plate 33 and the heat shielding plate 38 so as to protrude therefrom, respectively. Then, the air layer S between the heat shielding plate 38 and the control substrate 50 is always kept at a constant value through the convex portions 38a of the heat shielding plate 38.

As described above, as shown in FIG. 17, according to the electronic control unit embedded type electric coupling box 10 of the embodiment, the terminal plate 30 made of resin serving as the heat shielding plate is disposed at the position opposing to the main substrate 21 with the predetermined clearance therebetween, and the concave part housing portion 37 for holding the resistor 27 is integrally formed at the terminal plate 30. Thus, the soldering procedure (soldering flow procedure) between the pair of the lead portions 27b, 27b protruding from the main body 27a of the resistor 27 and the pair of the land portions 24, 24 of the main substrate 21 can be performed easily in the stable state that the main body 27a of the resistor 27 is held by the concave part housing portion 37 of the terminal plate 30. After the soldering procedure, the heat due to the radiation heat from the main body 27a of the resistor 27 can be dissipated and shielded by the terminal plate 30, whereby the temperature at the soldered portions H between the pair of the lead portions 27b, 27b of the resistor 27 and the pair of the land portions 24, 24 of the main substrate 21 can be prevented from being increased. As a result, the magnitude of the thermal stress acting on the soldered portions H can be reduced and so the occurrence of the crack of the solder at the soldered portions H can be surely prevented.

In particular, the pair of the insertion holes 37a, 37a and the pair of the insertion holes 21c, 21c for inserting therein the pair of the lead portions 27b, 27b of the resistor 27 are formed at the concave part housing portion 37 of the terminal plate 30 and the main substrate 21, respectively. Then, the pair of the lead portions 27b, 27b of the resistor 27 are inserted into the pair of the insertion holes 37a, 37a of the concave part housing portion 37 and the pair of the insertion holes 21c, 21c of the main substrate 21, respectively, and then the pair of the lead portions 27b, 27b and the pair of the land portions 24, 24 of the main substrate 21 are freely fixed to each other by the soldering. Thus, the pair of the insertion holes 37a, 37a etc. of the concave part housing portion 37 of the terminal plate 30 can be simply formed and processed so as to coincide with the pitch of the pair of the lead portions 27b, 27b of the resistor 27, and the soldered portions H are required only at the portions between the pair of the lead portions 27b, 27b of the resistor 27 and the pair of the land portions 24, 24 of the main substrate 21. Accordingly, the increase of the temperature due to the radiation heat from the main body 27a of the resistor 27 at the soldered portions H between the pair of the lead portions 27b, 27b of the resistor 27 and the pair of the land portions 24, 24 of the main substrate 21 can be suppressed easily at a low cost, and so the occurrence of the crack of the solder at the soldered portions H can be further surely prevented.

The pair of the lead portions 27b, 27b of the resistor 27 and the pair of the land portions 24, 24 of the main substrate 21 are freely fixed to each other by the soldering in the state that the main body 27a of the resistor 27 is separated from the bottom surface 37b of the concave part housing portion 37 of the terminal plate 30. Thus, since the main body 27a of the resistor 27 does not directly contact with the bottom surface 37b of the concave part housing portion 37 of the terminal plate 30, the deterioration due to the heat of the terminal plate 30 made of synthetic resin can be surely prevented. Further, the heat due to the radiation heat from the main body 27a of the resistor 27 can be surely dissipated on the terminal plate 30 side made of synthetic resin from the concave part housing portion 37 and also on the plate cover 40 side made of synthetic resin through the terminal plate 30, so that the dissipation effect can be further improved.

According to the embodiment, although the explanation has been made as to the electronic control unit embedded type electric coupling box containing an electronic control unit therein, it goes without saying that the embodiment is also applicable to an electric coupling box provided separately from an electric control unit and to an electric coupling box etc. not containing an electronic control unit therein.

As described above, according to the first aspect of the invention, the heat shielding plate is disposed at the position opposing to the substrate with the predetermined clearance therebetween, and the part housing portion for holding the heat generation part is provided at the heat shielding plate. Thus, the soldering procedure between the substrate and the lead portions protruding from the main body of the heat generation part can be performed easily in the stable state that the heat generation part is held by the part housing portion of the heat shielding plate. After the soldering procedure, the heat due to the radiation heat from the main body of the heat generation part can be dissipated and shielded by the heat shielding plate, whereby the temperature at the soldered portions can be prevented from being increased. As a result, the magnitude of the thermal stress acting on the soldered portions can be reduced and so the occurrence of the crack of the solder at the soldered portions can be surely prevented.

According to the second aspect of the invention, the insertion holes for inserting the lead portions of the heat generation part therein are formed at the concave part housing portion of the heat shielding plate and the substrate, respectively. The lead portions are inserted into these insertion holes of the concave part housing portion and the substrate, and the lead portions and the land portions of the substrate are freely fixed to each other by the soldering. Thus, the insertion holes of the concave part housing portion of the heat shielding plate can be simply formed so as to coincide with the pitch of the lead portions of the heat generation part, and the soldered portions are required only at the portions between the lead portions of the heat generation part and the land portions of the substrate. Accordingly, the increase of the temperature at the soldered portions due to the radiation heat from the main body of the heat generation part can be suppressed simply at a low cost and so the occurrence of the crack of the solder at the soldered portions can be further surely prevented.

According to the third aspect of the invention, the lead portions and the land portions of the substrate are freely fixed to each other by the soldering in the state that the main body of the heat generation part is separated from the bottom surface of the concave part housing portion of the heat shielding plate. Thus, since the main body of the heat generation part does not directly contact with the heat-shielding plate, the deterioration due to the heat of the heat shielding plate can be surely prevented. Further, the heat due to the radiation heat from the main body of the heat generation part can be surely dissipated on the heat shielding plate side from the concave part housing portion, so that the dissipation effect can be improved.

What is claimed is:

1. A holding and heat dissipation structure for a heat generation part soldered at a substrate and having lead portions protruded from a main body thereof, the holding and heat dissipation structure comprising:

a heat shielding plate disposed at a position opposing to the substrate with a predetermined clearance therebetween; and a part housing portion provided on the heat shielding plate for holding the heat generation part therein, wherein the part housing portion of the heat shielding plate is formed in a concave shape, insertion holes for inserting the lead portions are formed on the part housing portion and the substrate, respectively, the lead portions are inserted into the insertion holes of the part housing portion and the substrate, and the lead portions and land portions of the substrate are fixed to each other by soldering.

2. The holding and heat dissipation structure for the heat generation part according to claim 1, wherein the lead portions protruding from the main body are inserted into the insertion holes of the part housing portion of the heat shielding plate and the substrate, and the lead portions and the land portions of the substrate are fixed to each other by the soldering in a state that the main body of the heat generation part is separated from a bottom surface of the part housing portion.

3. The holding and heat dissipation structure for the heat generation part according to claim 1, wherein the predetermined clearance is formed by a plurality of cylindrical boss portions disposed between the heat shielding plate and the substrate.

* * * * *